(12) United States Patent
Inoue

(10) Patent No.: US 6,838,966 B2
(45) Date of Patent: Jan. 4, 2005

(54) CIRCULAR POLE PIECE AND MRI SYSTEM

(75) Inventor: Yuji Inoue, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 10/776,893

(22) Filed: Feb. 11, 2004

(65) Prior Publication Data

US 2004/0160297 A1 Aug. 19, 2004

(30) Foreign Application Priority Data

Feb. 12, 2003 (JP) ........................................ 2003/033959

(51) Int. Cl.[7] ............................ H01F 3/00; G01R 33/46
(52) U.S. Cl. ........................................ 335/297; 324/320
(58) Field of Search .......................... 335/216, 296–306; 324/318–320

(56) References Cited

U.S. PATENT DOCUMENTS

| | | | |
|---|---|---|---|
| 4,042,898 A | * 8/1977 | Tomita et al. | 335/297 |
| 4,753,822 A | 6/1988 | Van Mensvoort | |
| 5,317,297 A | 5/1994 | Kaufman et al. | |
| 5,363,078 A | * 11/1994 | Ries et al. | 335/297 |
| 5,680,086 A | 10/1997 | Allis et al. | |
| 6,127,825 A | 10/2000 | Goto | |
| 6,150,819 A | 11/2000 | Laskaris et al. | |
| 6,218,834 B1 | 4/2001 | Goto | |

FOREIGN PATENT DOCUMENTS

| | | |
|---|---|---|
| JP | 2000-185023 | 7/2000 |
| JP | 2000-200716 | 7/2000 |

* cited by examiner

Primary Examiner—Ramon M. Barrera
(74) Attorney, Agent, or Firm—Carl B. Horton, Esq.; Armstrong Teasdale LLP

(57) ABSTRACT

The object of the present invention is to minimize the residual magnetic induction in a circular pole piece included in a magnetic circuit for magnetic resonance imaging. A circular pole piece is divided into two portions, that is, a center portion and a marginal portion. A soft magnetic material that exhibits a high permeability (for example, 10000 or more) with a relatively small external magnetic field (for example, ranging from 20 A/m to 60 A/m) applied thereto is adopted as a soft magnetic material to be made into a center-portion laminate block. A soft magnetic material that exhibits a high permeability (for example, 6000 or more) with a relatively large external magnetic field (for example, ranging from 50 A/m to 150 A/m) applied thereto is adopted as a soft magnetic material to be made into a marginal-portion laminate block 103b. Consequently, since the residual magnetic induction in the circular pole piece can be minimized, the degradation in image quality attributable to a residual magnetic induction can be prevented.

14 Claims, 4 Drawing Sheets

Directional magnetic steel sheet tile

CIRCULAR POLE PIECE AND MRI SYSTEM

CROSS REFERENCE TO RELATED APPLICATIONS

This application claims the benefit of Japanese Application No. 2003-033959 filed Feb. 12, 2003.

BACKGROUND OF THE INVENTION

The present invention relates to a circular pole piece included in a magnetic circuit for magnetic resonance imaging (MRI) and an MRI system. More particularly, the present invention relates to a circular pole piece capable of minimizing a residual magnetic induction and an MRI system employing the circular pole piece.

In the past, a circular pole piece included in a magnetic circuit for magnetic resonance imaging (MRI) has been shaped substantially circularly as a whole by arranging laminate blocks each of which has square or rectangular silicon steel sheet tiles or heteromorphic soft magnetic material tiles, each of which is used to fill a gap among adjoining square or rectangular tiles, layered (see, for example, FIG. 1 in Patent Document 1). Otherwise, the circular pole piece has been shaped substantially circularly as a whole by arranging laminate blocks, each of which has trapezoidal or annularly sectoral soft magnetic material tiles, layered in the form of multiple concentric rings (see, for example, FIG. 21 in the Patent Document 1).

The soft magnetic material tiles are made of, for example, a silicon steel sheet and exhibit a hysteresis. Therefore, after a magnetic field gradient is applied to the circular pole piece, a residual magnetic induction occurs in the circular pole piece. The magnetic induction varies depending on a change in the magnetic field gradient. However, when the residual magnetic induction in the circular pole piece varies, it affects an image.

In the past, efforts have been made to devise a pulse sequence that is effective in suppressing the adverse effect (refer to, for example, Patent Document 2).

[Patent Document 1]

Japanese Unexamined Patent Application Publication No. 2000-200716

[Patent Document 2]

Japanese Unexamined Patent Application Publication No. 2000-185023

In the past, the adverse effect of the residual magnetic induction in a circular pole piece has been suppressed by devising a pulse sequence. However, this imposes a load on an MRI system.

BRIEF DESCRIPTION OF THE INVENTION

An object of the present invention is to provide a circular pole piece and an MRI system capable of minimizing a residual magnetic induction.

According to the first aspect of the present invention, a circular pole piece included in a magnetic circuit for magnetic resonance imaging is divided into at least two portions, that is, a center portion including the center of the circular pole piece and a marginal portion including the margin thereof. The permeability which the center portion made of a soft magnetic material exhibits with an external magnetic field applied thereto is higher than that of the marginal portion made of a soft magnetic material.

The higher the permeability is, the smaller the residual magnetic induction in a soft magnetic material is. Therefore, the permeability should be as high as possible.

On the other hand, the external magnetic field strength applied to the center portion of the circular pole piece is different from that applied to the marginal portion thereof. The external magnetic field strength applied to the center portion ranges, for example, from 20 A/m to 60 A/m, while the external magnetic field strength applied to the marginal portion ranges, for example, from 50 A/m to 150 A/m.

The permeability of a soft magnetic material varies depending on the strength of an applied magnetic field. The strength of an external magnetic field maximizing the permeability depends on the soft magnetic material.

In the circular pole piece in accordance with the first aspect, the permeability which the center portion made of a soft magnetic material exhibits with a feebler external magnetic field than that applied to the marginal portion applied thereto is higher than the permeability which the marginal portion made of a soft magnetic material exhibits with a stronger external magnetic field than that applied to the center portion applied thereto. This results in a smaller residual magnetic induction in the center portion located near an imaging area. Although the residual magnetic induction in the marginal portion is larger than that in the center portion, the adverse effect of the residual magnetic induction in the marginal portion is limited because the marginal portion is located far from the imaging area.

According to the second aspect of the present invention, a circular pole piece has the same structure as the foregoing one. However, the compositions of the soft magnetic materials to be made into the respective portions of the circular pole piece are different from each other.

In the circular pole piece in accordance with the second aspect, the soft magnetic material to be made into the center portion and that to be made into the marginal portion are selected under the following conditions.

(1) Adopted as the soft magnetic material to be made into the center portion is a soft magnetic material that exhibits as high a permeability as possible (for example, 10000 or more) with a relatively small external magnetic field (for example, ranging from 20 A/m to 60 A/m) applied thereto.

(2) Adopted as the soft magnetic material to be made into the marginal portion is a soft magnetic material that exhibits as high a permeability as possible (for example, 6000 or more) with a relatively large external magnetic field (for example, ranging from 50 A/m to 150 A/m) applied thereto.

(3) The permeability which the soft magnetic material to be made into the center portion exhibits with an external magnetic field applied thereto is higher than the one which the soft magnetic material to be made into the marginal portion exhibits with an external magnetic field applied thereto. Experiments performed by the present inventor demonstrate that: when the maximum value of the permeability which the soft magnetic material to be made into the center portion exhibits with an external magnetic field applied thereto is twice or more higher than that of the permeability of the soft magnetic material to be made into the marginal portion, the residual magnetic induction in the center portion located near the imaging area can be minimized.

According to the third aspect of the present invention, a circular pole piece has the same structure as the aforesaid ones. Herein, the center portion made of a soft magnetic material has a plurality of directional magnetic steel sheet tiles layered with the directions of the axes of easy magnetization of the respective tiles varied so that the tiles will exhibit a non-directional property as a whole. The marginal portion made of a soft magnetic material is formed with non-directional magnetic steel sheet tiles devoid of an axis of easy magnetization.

The permeability of a directional magnetic steel sheet is higher in the center thereof to which a relatively week external magnetic field is applied. On the other hand, the permeability of a non-directional magnetic steel sheet is lower than the permeability which the center of the directional magnetic steel sheet exhibits with an external magnetic field applied thereto. However, the non-directional magnetic steel sheet is inexpensive.

Therefore, in the circular pole piece in accordance with the third aspect, the directional magnetic steel sheet is adopted for the center portion, and the non-directional magnetic steel sheet is adopted for the marginal portion. Consequently, the residual magnetic induction in the center portion located near the imaging area can be minimized, and the cost of the circular pole piece can be lowered.

Moreover, directional magnetic steel sheet tiles are layered with the directions of the axes of easy magnetization thereof varied so that the tiles will exhibit a non-directional property as a whole. Therefore, a residual magnetic induction can be minimized irrespective of the direction of an external magnetic field (in particular, the direction of a magnetic field gradient).

According to the fourth aspect of the present invention, a circular pole piece has the same structure as the aforesaid ones. Herein, the center portion made of a soft magnetic material has a plurality of directional magnetic steel sheet tiles layered with the directions of the axes of easy magnetization thereof varied so that the tiles will exhibit a non-directional property as a whole, and has a non-directional magnetic steel sheet tile, which is devoid of an axis of easy magnetization, layered in combination with the directional magnetic steel sheet tile. The marginal portion made of a soft magnetic material is formed with non-directional magnetic steel sheet tiles devoid of an axis of easy magnetization.

The permeability of a directional magnetic steel sheet is higher in the center thereof to which a relatively feeble external magnetic field is applied. On the other hand, the permeability of a non-directional magnetic steel sheet is lower than the permeability which the center of the directional magnetic steel sheet exhibits with an external magnetic field applied thereto. However, the non-directional magnetic steel sheet is inexpensive.

In the circular pole piece in accordance with the fourth aspect, the center portion is formed by combining a directional magnetic steel sheet and a non-directional magnetic steel sheet, and the marginal portion is formed with a non-directional magnetic steel sheet. Consequently, the residual magnetic induction in the center portion located near the imaging area can be minimized, and the cost of the circular pole piece can be further lowered.

Moreover, directional magnetic steel sheet tiles are layered with the directions of the axes of easy magnetization thereof varied so that the tiles will exhibit a non-directional property as a whole. A residual magnetic induction can therefore be minimized irrespective of the direction of an external magnetic field (especially, the direction of a magnetic field gradient).

According to the fifth aspect of the present invention, a circular pole piece has the same structure as the aforesaid ones. Herein, the center portion of the circular pole piece made of a soft magnetic material has a plurality of directional magnetic steel sheet tiles layered with the directions of the axes of easy magnetization thereof varied so that the tiles will exhibit a non-directional property as a whole. The marginal portion made of a soft magnetic material has a plurality of directional magnetic steel sheet tiles layered with the directions of the axes of easy magnetization thereof varied so that the tiles will exhibit a non-directional property as a whole, and has a non-directional magnetic steel sheet tile, which is devoid of an axis of easy magnetization, layered in combination with the directional magnetic steel sheet tiles.

The permeability of a directional magnetic steel sheet is higher in the center of the directional magnetic steel sheet to which a relatively feeble external magnetic field is applied. On the other hand, the permeability of a non-directional magnetic steel sheet is lower than the permeability which the center of the directional magnetic steel sheet exhibits with the external magnetic field applied thereto. However, the non-directional magnetic steel sheet is inexpensive.

In the circular pole piece in accordance with the fifth aspect, a directional magnetic steel sheet is adopted for the center portion, and the combination of a directional magnetic steel sheet and a non-directional magnetic steel sheet is adopted for the marginal portion. Consequently, the residual magnetic induction in the center portion located near the imaging area can be minimized, and the cost of the circular pole piece can be lowered.

Moreover, directional magnetic steel sheet tiles are layered with the directions of the axes of easy magnetization thereof varied so that the tiles will exhibit a non-directional property as a whole. A residual magnetic induction can therefore be minimized irrespective of the direction of an external magnetic field (especially, the direction of a magnetic field gradient).

According to the sixth aspect of the present invention, a circular pole piece has the same structure as the aforesaid ones. Herein, the center portion made of a soft magnetic material and the marginal portion made of a soft magnetic material have a plurality of directional magnetic steel sheet tiles layered with the directions of the axes of easy magnetization thereof varied so that the tiles will exhibit a non-directional property as a whole.

The permeability of a directional magnetic steel sheet is relatively high in the center of the directional magnetic steel sheet to which a relatively feeble external magnetic field is applied. The permeability thereof in the margin thereof to which a relatively strong external magnetic field is applied is relatively low.

In the circular pole piece in accordance with the sixth aspect, the same directional magnetic steel sheet is adopted for the center portion and marginal portion. Consequently, the residual magnetic induction in the center portion located near the imaging area can be minimized, and the labor for using different soft magnetic materials is obviated.

Moreover, directional magnetic steel sheet tiles are layered with the directions of the axes of easy magnetization thereof varied so that the tiles will exhibit a non-directional property as a whole. A residual magnetic induction can be minimized irrespective of the direction of an external magnetic field (especially, the direction of a magnetic field gradient).

According to the seventh aspect of the present invention, a circular pole piece has the same structure as the aforesaid ones. Herein, the center portion made of a soft magnetic material and the marginal portion made of a soft magnetic material have a plurality of directional magnetic steel sheet tiles layered with the directions of the axes of easy magnetization thereof varied so that the tiles will exhibit a non-directional property as a whole, and has a non-directional magnetic steel sheet tile, which is devoid of an axis of easy magnetization, layered in combination with the directional magnetic steel sheet tiles.

The permeability of a directional magnetic steel sheet is relatively high in the center of the directional magnetic steel sheet to which a relatively feeble external magnetic field is applied. The permeability of the directional magnetic steel sheet is relatively low in the margin thereof to which a relatively strong external magnetic field is applied. On the other hand, the permeability of a non-directional magnetic steel sheet is lower than the permeability which the center of the directional magnetic steel sheet exhibits with an external magnetic field applied thereto. However, the non-directional magnetic steel sheet is inexpensive.

In the circular pole piece in accordance with the seventh aspect, the combination of a directional magnetic steel sheet and a non-directional magnetic steel sheet is adopted for both the center portion and marginal portion. Consequently, the residual magnetic induction in the center portion located near the imaging area can be minimized, and the cost of the circular pole piece can be lowered.

Moreover, directional magnetic steel sheet tiles are layered with the directions of axes of easy magnetization thereof varied so that the tiles will exhibit a non-directional property as a whole. Consequently, the residual magnetic induction can be minimized irrespective of the direction of an external magnetic field (especially, the direction of a magnetic field gradient).

According to the eighth aspect of the present invention, a circular pole piece has the same structure as the aforesaid ones. Herein, the ratio of a non-directional magnetic steel sheet tile to directional magnetic steel sheet tiles is higher in the marginal portion made of a soft magnetic material than in the center portion made of a soft magnetic material.

The higher the ratio of a non-directional magnetic steel sheet tile to directional magnetic steel sheet tiles is, the lower the permeability is.

In the circular pole piece in accordance with the eighth aspect, the ratio of a non-directional magnetic steel sheet tile adopted for the center portion is relatively low, and the ratio of a non-directional steel sheet adopted for the marginal portion is relatively high. Consequently, the residual magnetic induction in the center portion located near the imaging area can be minimized, and the cost of the circular pole piece can be lowered.

According to the ninth aspect of the present invention, a circular pole piece has the same structure as the aforesaid ones. Herein, the center portion made of a soft magnetic material has a plurality of directional magnetic steel sheet tiles layered with the directions of axes of easy magnetization thereof varied so that the tiles will exhibit a non-directional property as a whole. The marginal portion made of a soft magnetic material is formed with ferrite tiles.

In the circular pole piece in accordance with the ninth aspect, the permeability which the center portion made of a soft magnetic material exhibits with an external magnetic field applied thereto is higher than the permeability of the marginal portion made of a soft magnetic material. Consequently, the residual magnetic induction in the center portion can be minimized.

According to the tenth aspect of the present invention, a circular pole has the same structure as the aforesaid ones. Herein, the center portion made of a soft magnetic material is formed by combining a plurality of directional magnetic steel sheets tiles that is manufactured with the directions of axes of easy magnetization thereof varied and is layered so that the tiles will exhibit a non-directional property as a whole, and non-directional magnetic steel sheet tiles devoid of an axis of easy magnetization. The marginal portion made of a soft magnetic material is formed with ferrite tiles.

In the circular pole piece in accordance with the tenth aspect, the permeability which the center portion made of a soft magnetic material exhibits with an external magnetic field applied thereto is higher than the permeability of the marginal portion made of a soft magnetic material. Consequently, the residual magnetic induction in the center portion can be minimized.

According to the eleventh aspect of the present invention, a circular pole piece has the same structure as the aforesaid ones. Herein, the center portion made of a soft magnetic material is formed with amorphous soft magnetic material tiles, and the marginal portion made of a soft magnetic material is formed with non-directional magnetic steel sheet tiles devoid of an axis of easy magnetization.

The permeability of an amorphous soft magnetic material is higher than the permeability of a non-directional magnetic steel sheet.

In the circular pole piece in accordance with the eleventh aspect, the amorphous soft magnetic material is adopted for the center portion. Consequently, the residual magnetic induction in the center portion can be minimized.

According to the twelfth aspect of the present invention, a circular pole piece has the same structure as the aforesaid ones. The center portion made of a soft magnetic material is formed with Permalloy tiles, and the marginal portion made of a soft magnetic material is formed with non-directional magnetic steel sheet tiles devoid of an axis of easy magnetization.

The permeability of Permalloy is higher than that of the non-directional magnetic steel sheet.

In the circular pole piece in accordance with the twelfth aspect, Permalloy is adopted for the center portion. Consequently, the residual magnetic induction in the center portion can be minimized.

According to the thirteenth aspect of the present invention, a circular pole piece has the same structure as the aforesaid ones. Herein, the center portion made of a soft magnetic material is formed with Permalloy tiles, and the marginal portion made of a soft magnetic material is formed with ferrite tiles.

The permeability of Permalloy is higher than that of a ferrite.

In the circular pole piece in accordance with the thirteenth aspect, Permalloy is adopted for the center portion. Consequently, the residual magnetic induction in the center portion can be minimized.

According to the fourteenth aspect of the present invention, there is provided an MRI system including a circular pole piece that has the same structure as the aforesaid ones.

In the MRI system in accordance with the fourteenth aspect, the residual magnetic induction in the center portion of the circular pole piece can be minimized. Consequently, the adverse effect of the residual magnetic induction can be suppressed, and the MRI image quality can be improved.

According to a circular pole piece and an MRI system in which the present invention is implemented, the residual magnetic induction in the center portion of the circular pole piece located near an imaging area can be minimized. This results in the improved MRI image quality.

Further objects and advantages of the present invention will be apparent from the following description of the preferred embodiments of the invention as illustrated in the accompanying drawings.

DETAILED DESCRIPTION OF THE INVENTION

The present invention will be described in relation to illustrated embodiments below.

First Embodiment

Figure 1:
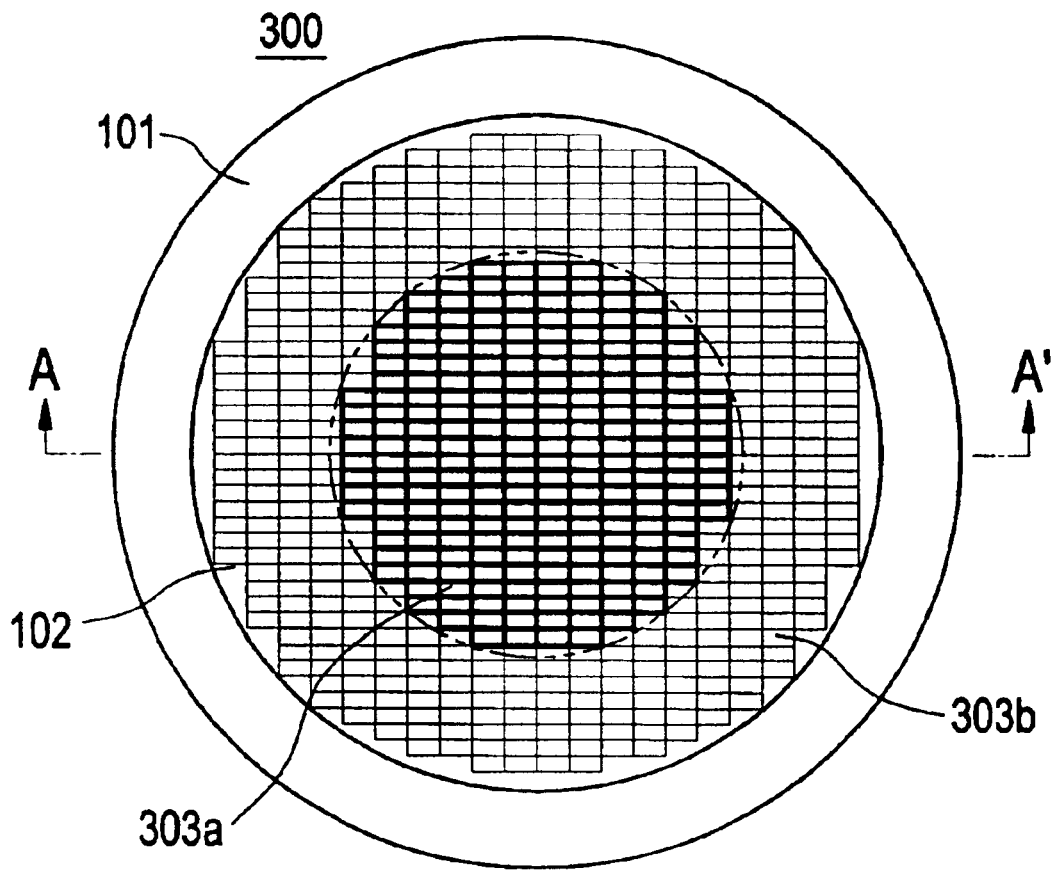
FIG. 1 is a plan view showing a circular pole piece in accordance with a first embodiment of the present invention
Figure 2:
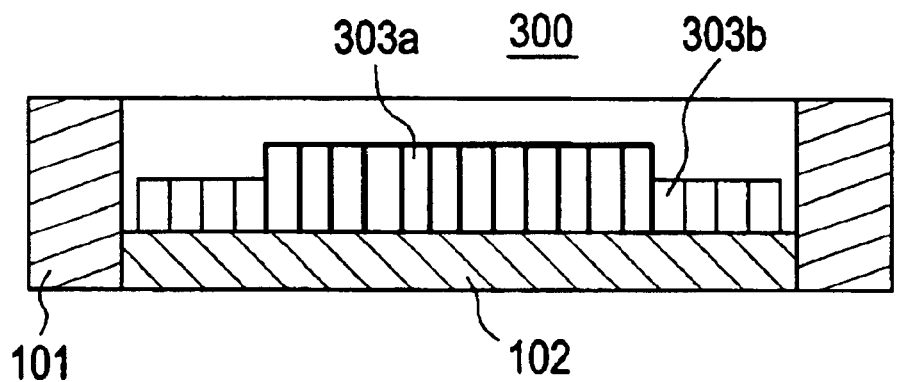
FIG. 2 is an A–A' sectional view of the circular pole piece shown in FIG. 2.

FIG. 1 is a plan view showing a circular pole piece 300 in accordance with a first embodiment. FIG. 2 is an A–A' sectional view of the circular pole piece shown in FIG. 1.

The circular pole piece 300 comprises: a ring 101; a disk-like base 102 disposed inside the ring 101 and made of a carbon steel; center-portion laminate blocks 303a arranged substantially circularly on the center portion of the base 102; and marginal-portion laminate blocks 303b arranged substantially like a doughnut on the marginal portion of the base 102.

The height of the center-portion laminate blocks 303a is, for example, 42 mm, and the height of the marginal-portion laminate blocks 303b is, for example, 36 mm.

Figure 3:
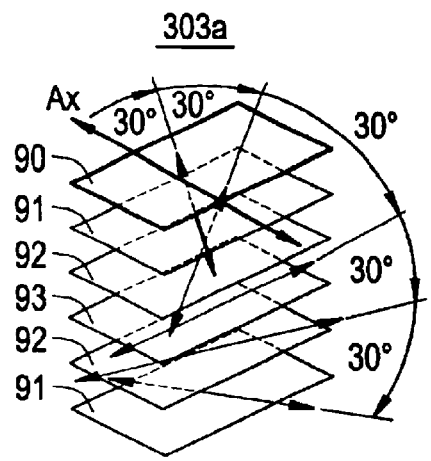
FIG. 3 is a perspective view showing the laminate structure of a center-portion laminate block employed in the first embodiment.

FIG. 3 is an explanatory diagram showing the laminate structure of each of the center-portion laminate blocks 303a.

Each of the center-portion laminate blocks 303a comprises: a directional magnetic steel sheet tile 90 having an axis of easy magnetization Ax in the direction of the short sides of the block; a directional magnetic steel sheet tile 91 having an axis of easy magnetization Ax in a direction defined by turning the short-side direction 300 clockwise; a directional magnetic steel sheet tile 92 having an axis of easy magnetization Ax in a direction defined by turning the short-side direction 600 clockwise; a directional magnetic steel sheet tile 93 having an axis of easy magnetization Ax in the direction of the long sides of the block; a directional magnetic steel sheet tile 92 that is manufactured by turning over the directional magnetic steel sheet tile 92, which the axis of easy magnetization Ax in the direction defined by turning the short-side direction 600 clockwise, so that it will have an axis of easy magnetization Ax in a direction defined by turning the long-side direction 300 clockwise; and a directional magnetic steel sheet tile 91 that is manufactured by turning over the directional magnetic steel sheet tile 91, which has the axis of easy magnetization Ax in the direction defined by turning the short-side direction 300 clockwise, so that it will have an axis of easy magnetization Ax in a direction defined by turning the long-side direction 600 clockwise. These tiles are repeatedly layered so that they will exhibit a non-directional property as a whole. The directional magnetic steel sheet tiles 90 to 93 are shaped like a rectangle whose short sides are 2.5 cm long and whose long sides are 5 cm long. Incidentally, the long sides may be 5 cm or less in length. The thickness of the directional magnetic steel sheet tiles 90 to 93 is, for example, 0.35 mm.

Consequently, 120 directional magnetic steel sheet tiles are layered.

Figure 4:
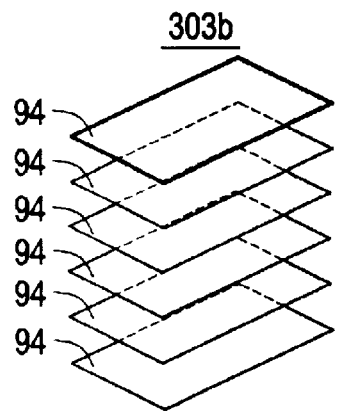
FIG. 4 is a perspective view showing the laminate structure of a marginal-portion laminate block employed in the first embodiment.

FIG. 4 is an explanatory diagram showing the laminate structure of each of the marginal-portion laminate blocks 303b.

Each of the marginal-portion laminate blocks 303b has non-directional magnetic steel sheet tiles 94, which are shaped like a rectangle whose short sides are 2.5 cm long and whose long sides are 5 cm long, layered. The thickness of the non-directional magnetic steel sheet tiles 94 is, for example, 0.35 mm. Consequently, 102 non-directional magnetic steel sheet tiles 94 are layered.

Figure 5:
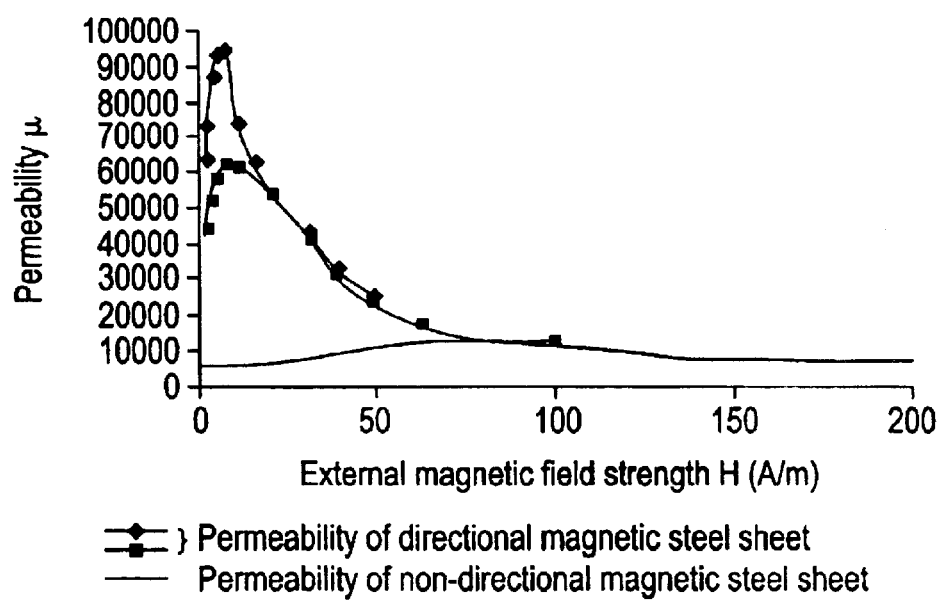
FIG. 5 shows a characteristic curve indicating the changes in the permeabilities of a directional magnetic steel sheet and a non-directional magnetic steel sheet respectively deriving from application of an external magnetic field.

FIG. 5 shows a characteristic curve indicating the permeabilities which a directional magnetic steel sheet and a non-directional magnetic steel sheet exhibit with an external magnetic field applied thereto.

The strength of an external magnetic field applied to the center portion of the circular pole piece 300 ranges, for example, from 20 A/m to 60 A/m. The strength of an external magnetic field applied to the marginal portion thereof ranges, for example, from 50 A/m to 150 A/m. The permeability which the directional magnetic steel sheet tiles 90 to 93 exhibit with an external magnetic field applied thereto is twice or more larger than the permeability which the non-directional magnetic steel sheet tiles 94 exhibit with the external magnetic field applied thereto.

Consequently, the residual magnetic induction in the center portion of the circular pole piece 300 can be minimized.

The center-portion laminate block 303a shown in FIG. 3 is manufactured as described below.

Figure 6:
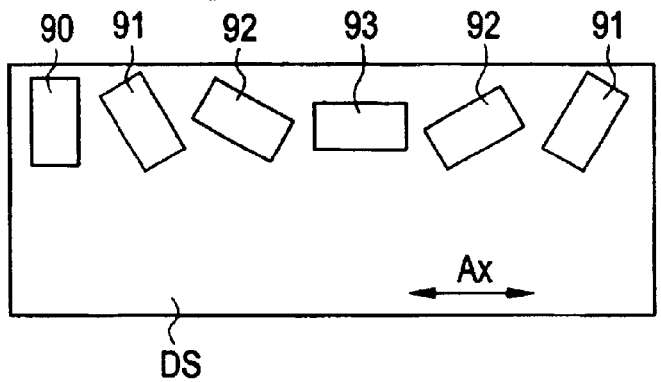
FIG. 6 is an explanatory diagram concerning a method of manufacturing directional magnetic steel sheet tiles employed in the first embodiment.

First, as shown in FIG. 6, a directional magnetic steel sheet DS is cut using a die in order to produce numerous directional magnetic steel sheet tiles 90 to 93.

Thereafter, as shown in FIG. 3, a required number of directional magnetic steel sheet tiles 90 to 93 are layered by performing internal die caulking or the like. This results in the center-portion laminate block 303a.

Figure 7:
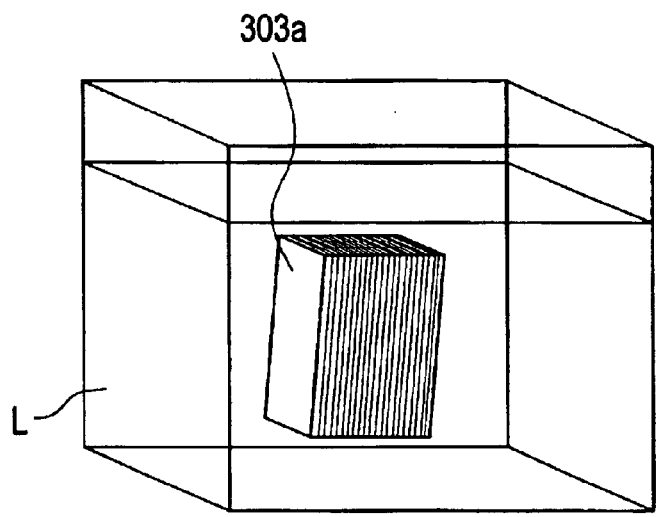
FIG. 7 is an explanatory diagram showing integration of a center-portion laminate block through bonding employed in the first embodiment.

Thereafter, as shown in FIG. 7, the center-portion laminate block 303a is immersed in an adhesive solution L. Thereafter, the center-portion laminate block 303a is hardened and integrated for fear it may be disunited with electromagnetic force.

The marginal-portion laminate block 303b shown in FIG. 4 is manufactured as described below.

Figure 8:
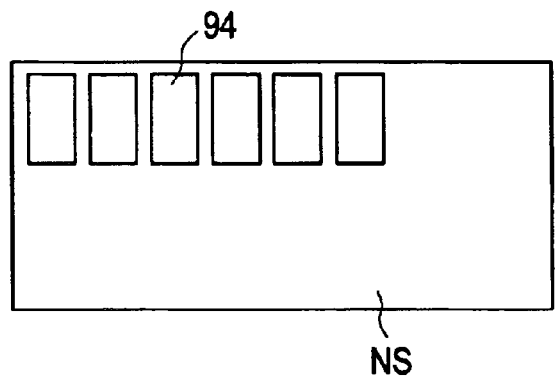
FIG. 8 is an explanatory diagram concerning a method of manufacturing non-directional magnetic steel sheet tiles employed in the first embodiment.

First, as shown in FIG. 8, a non-directional magnetic steel sheet NS is cut using a die in order to produce numerous non-directional magnetic steel sheet tiles 94.

Thereafter, as shown in FIG. 4, a required number of non-directional magnetic steel sheet tiles 94 are layered to produce the marginal-portion laminate block 303b.

Similarly to the one shown in FIG. 7, the marginal-portion laminate block 303b is immersed in the adhesive solution L. Thereafter, the marginal-portion laminate block 303b is hardened and integrated.

Using the foregoing circular pole piece 300, the residual magnetic induction in the center portion thereof located near the imaging area can be minimized. Moreover, since the maximum length of the center-portion laminate block 303a and marginal-portion laminate block 303b is 5 cm, the adverse effect of an eddy current caused with application of a magnetic field gradient can be minimized.

Second Embodiment

Figure 9:
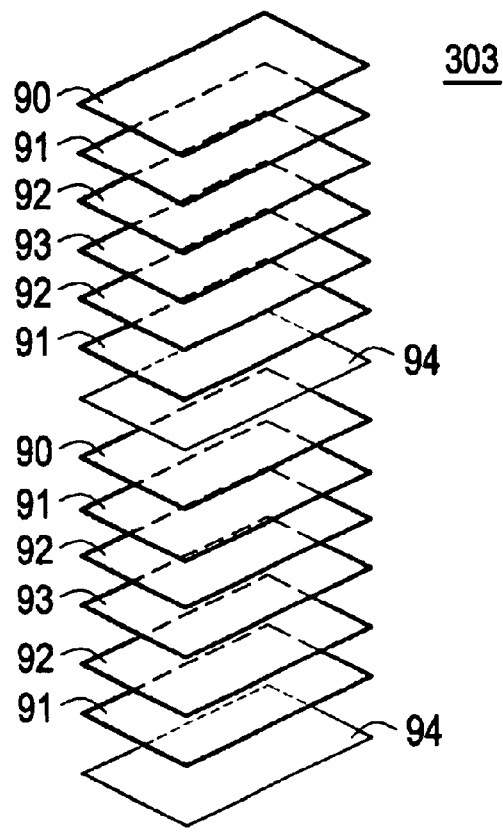
FIG. 9 is a perspective view showing the laminate structure of a laminate block employed in second to fourth embodiments.

FIG. 9 is an explanatory diagram showing the laminate structure of a laminate block 303 employed in a second embodiment.

The laminate block 303 comprises: a directional magnetic steel sheet tile 90 having an axis of easy magnetization Ax in the direction of the short sides of the block; a directional magnetic steel sheet tile 91 having an axis of easy magnetization Ax in a direction defined by turning the short-side direction 300 clockwise; a directional magnetic steel sheet tile 92 having an axis of easy magnetization Ax in a direction defined by turning the short-side direction 600 clockwise; a directional magnetic steel sheet tile 93 having an axis of easy magnetization Ax in the direction of the long sides of the block; a directional magnetic steel sheet tile 92 that is manufactured by turning over the directional magnetic steel sheet tile 92, which has the axis of easy magnetization Ax in the direction defined by turning the short-side direction 60□ clockwise, so that it will have an axis of easy magnetization Ax in a direction defined by turning the long-side direction 30□ clockwise; a directional magnetic steel sheet tile 91 that is manufactured by turning over the directional magnetic steel sheet tile 91, which has the axis of easy magnetization Ax in the direction defined by turning the short-side direction 30□ clockwise, so that it will have an axis of easy magnetization Ax in a direction defined by turning the long-side direction 60□ clockwise; and a non-directional magnetic steel sheet tile 94. These tiles are repeatedly layered so that they will exhibit a non-directional property as a whole.

When the laminate block 303 shown in FIG. 9 is adopted for the center-portion laminate block 303a, it is combined with the margin laminate block 303b shown in FIG. 4.

When the laminate block 303 shown in FIG. 9 is adopted for the marginal-portion laminate block 303b, it is combined with the center-portion laminate block 303a shown in FIG. 3.

The laminate block 303 shown in FIG. 9 is manufactured as described below.

First, as shown in FIG. 6, a directional magnetic steel sheet DS is cut using a die in order to produce numerous directional magnetic steel sheet tiles 90 to 93.

Thereafter, as shown in FIG. 8, a non-directional magnetic steel sheet NS is cut using a die in order to produce numerous non-directional magnetic steel sheet tiles 94.

Thereafter, as shown in FIG. 9, a required number of directional magnetic steel sheet tiles 90 to 93 and a required number of non-directional magnetic steel sheet tiles 94 are layered to produce the laminate block 303.

Similarly to the one shown in FIG. 7, the laminate block 303 is immersed in the adhesive solution L, and then hardened and integrated.

Third Embodiment

The center-portion laminate block 303a shown in FIG. 3 may be adopted as the marginal-portion laminate block 303b. This is because in the marginal portion of the circular pole piece 300, there is no large difference between the permeability which the directional magnetic steel sheet tiles 90 to 93 exhibit with an external magnetic field applied thereto and the permeability of the non-directional magnetic steel sheet tiles 94.

Fourth Embodiment

The laminate block 303 shown in FIG. 9 may be adopted as the center-portion laminate block 303a and marginal-portion laminate block 303b alike. In this case, preferably, the ratio of the non-directional magnetic steel sheet tile 94 to the directional magnetic steel sheet tiles 90 to 93 is made relatively low in the center-portion laminate block 303a but made relatively high in the marginal-portion laminate block 303b.

Fifth Embodiment

A directional magnetic steel sheet may be adopted as a soft magnetic material to be made into the center-portion laminate block 303a, and a ferrite may be adopted as a soft magnetic material to be made into the marginal-portion laminate block 303b.

Sixth Embodiment

The combination of a directional magnetic steel sheet and a non-directional magnetic steel sheet may be adopted as a soft magnetic material to be made into the center-portion laminate block 303a. A ferrite may be adopted as a soft magnetic material to be made into the marginal-portion laminate block 303b.

Seventh Embodiment

An amorphous soft magnetic material or Permalloy may be adopted as a soft magnetic material to be made into the center-portion laminate block 303a, and a non-directional magnetic steel sheet or a ferrite may be adopted as a soft magnetic material to be made into the marginal-portion laminate block 303b.

An amorphous soft magnetic material such as Co-NbZr (metal—metal series) or Co-Fe-B-Si (metal-metalloid series) may be adopted as the amorphous soft magnetic material.

Eighth Embodiment

Figure 10:
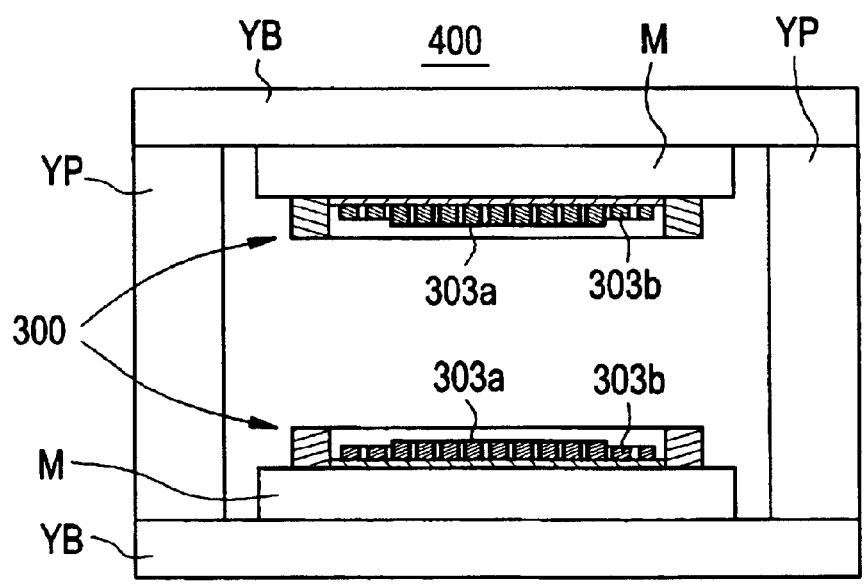
FIG. 10 is a sectional view showing the major part of an MRI system in accordance with an eighth embodiment.

FIG. 10 is a sectional view showing the major part of an MRI system in accordance with an eighth embodiment.

An MRI system 400 is an open MRI system. Herein, a magnetic circuit composed of permanent magnets M vertically opposed to each other, base yokes YB, support yokes YP, and circular pole pieces 300 is used to induce a static magnetic field in a vertical direction between the circular pole pieces 300.

According to the MRI system 400, since the residual magnetic induction in each of the center portions of the circular pole pieces 300 is limited, the adverse effect of the residual magnetic induction can be suppressed and the MRI image quality can be improved.

Incidentally, the circular pole piece in accordance with any of the second to seventh embodiments may be adopted as the circular pole pieces 300.

Moreover, a superconducting magnet may be adopted on behalf of the permanent magnets M.

Other Embodiments (1) In the aforesaid embodiments, the circular pole piece 300 is divided into two portions, that is, the center portion and marginal portion. Alternatively, the circular pole piece 300 may be divided into three or more portions, that is, the center portion and marginal portion, and one or more intermediate portions. In this case, a soft magnetic material permitting the highest possible permeability with an external magnetic field applied thereto should be adopted for the portions. Therefore, for example, the circular pole piece may be divided into three portions, that is, the center portion, marginal portion, and intermediate portion, soft magnetic materials having different compositions may be adopted for the respective portions.

(2) The center-portion laminate block 303a and marginal-portion laminate block 303b may be shaped like a square or a trapezoid.

Many widely different embodiments of the invention may be configured without departing from the spirit and the scope of the present invention. It should be understood that the present invention is not limited to the specific embodiments described in the specification, except as defined in the appended claim.

What is claimed is:

1. A circular pole piece included in a magnetic circuit for magnetic resonance imaging (MRI), said circular pole piece comprising:
   a center portion including the center of said circular pole piece and a first set having a plurality of directional magnetic sheet tiles layered based on directions of axes of easy magnetization; and a marginal portion surrounding the center portion, wherein a permeability which said center portion made of a first soft magnetic material exhibits with an external magnetic field applied thereto is higher than a permeability of said marginal portion made of a second soft magnetic material.

2. A circular pole piece according to claim 1, wherein a composition of the first soft magnetic material is different than a composition of the second soft magnetic material.

3. A circular pole piece according to claim 1, wherein a first of the directions of easy magnetization of a first of the directional magnetic sheet tiles is different than a second of the directions of a second of the directional magnetic sheet tiles, the directional magnetic sheet tiles of the first set collectively exhibit a non-directional property and are made from steel, and said marginal portion includes a second set of at least one non-directional magnetic steel sheet tile devoid of an axis of easy magnetization.

4. A circular pole piece according to claim 1, wherein the first set includes at least one non-directional magnetic sheet tile devoid of an axis of easy magnetization and layered in combination with the directional magnetic sheet tiles of the first set, a first of the directions of easy magnetization of a first of the directional magnetic sheet tiles is different than a second of the directions of a second of the directional magnetic sheet tiles, the directional magnetic sheet tiles of the first set collectively exhibit a non-directional property and are made from steel, and said marginal portion includes a second set of at least one non-directional magnetic steel sheet tile devoid of an axis of easy magnetization.

5. A circular pole piece according to claim 1, wherein a first of the directions of easy magnetization of a first of the directional magnetic sheet tiles in the first set is different than a second of the directions of a second of the directional magnetic sheet tiles in the first set of the directional magnetic sheet tiles of the first set collectively exhibit a non-directional property and are made from steel, the marginal portion includes a second set having a plurality of directional magnetic sheet tiles layered based on directions of easy magnetization, a first of the directions of easy magnetization of a first of the directional magnetic sheet tiles in the second set is different than a second of the directions of a second of the directional magnetic sheet tiles in the second set, the directional magnetic sheet tiles in the second set collectively exhibit a non-directional property, are made from steel, and layered in combination with at least one non-directional magnetic sheet tile of the second set, and the at least one non-directional magnetic sheet tile of the second set devoid of an axis of easy magnetization.

6. A circular pole piece according to claim 1, wherein the marginal portion includes a second set having a plurality of directional magnetic sheet tiles layered based on directions of easy magnetization, a first of the directions of easy magnetization of a first of the directional sheet tiles in the second set is different than a second of the directions of a second of the directional sheet tiles in the second set, the directional sheet tiles in the second set collectively exhibit a non-directional property and are made from steel.

7. A circular pole piece according to claim 1, wherein a first of the directions of easy magnetization of a first of the directional magnetic sheet tiles in the first set is different than a second of the directions of a second of the directional magnetic sheet tiles in the first set, the directional magnetic sheet tiles of the first set collectively exhibit a non-directional property and are made from steel, the first set including at least one non-directional magnetic steel sheet tile devoid of an axis of easy magnetization and layered in combination with said directional magnetic steel sheet tiles.

8. A circular pole piece according to claim 1, wherein the first set includes at least one non-directional magnetic sheet tile devoid of an axis of easy magnetization and layered in combination with the directional magnetic sheet tiles of the first set, the marginal portion includes a second set having a plurality of directional magnetic sheet tiles layered based on directions of easy magnetization, a first of the directions of easy magnetization of a first of the directional magnetic sheet tiles in the second set is different than a second of the directions of a second of the directional magnetic sheet tiles in the second set, the directional magnetic sheet tiles in the second set collectively exhibit a non-directional property, are made from steel, and layered in combination with at least one non-directional magnetic sheet tile, the non-directional magnetic sheet tile of the second set devoid of an axis of easy magnetization, and the ratio of the at least one non-directional magnetic sheet tile in the second set to the directional magnetic steel sheet tiles in the second set is higher E a ratio of the at least one non-directional magnetic sheet tile in the first set to the directional magnetic sheet tiles in the first set.

9. A circular pole piece according to claim 1, wherein a first of the directions of easy magnetization of a first of the directional magnetic sheet tiles is different than a second of the directions of a second of the directional magnetic sheet tiles, the directional magnetic sheet tiles of the first set collectively exhibit a non-directional property and are made from steel, and said marginal portion includes ferrite tiles.

10. A circular pole piece according to claim 1, wherein the first set includes at least one non-directional magnetic steel sheet tile, devoid of an axis of easy magnetization and layered in combination with said directional magnetic sheet tiles of the first set, a first of the directions of easy magnetization of a first of the directional magnetic sheet tiles is different than a second of the directions of a second of the directional magnetic sheet tiles, the directional magnetic sheet tiles of the first set collectively exhibit a non-directional property and are made from steel and said marginal portion includes ferrite tiles.

11. A circular pole piece according to claim 1, wherein said center portion includes amorphous soft magnetic material tiles, and said marginal portion includes non-directional magnetic steel sheet tiles devoid of an axis of easy magnetization.

12. A circular pole piece according to claim 1, wherein said center portion includes Parmalloy tiles, and said marginal portion includes non-directional magnetic steel sheet tiles devoid of an axis of easy magnetization.

13. A circular pole piece according to claim 1, wherein said center portion includes Parmalloy tiles, and said marginal portion includes ferrite tiles.

14. An MRI system comprising a circular pole piece comprising:
a center portion made of a first soft magnetic material; and
a marginal portion made of a second soft magnetic material and including a set of at least one non-directional magnetic sheet tile devoid of an axis of easy magnetization, said marginal portion circumscribing said center portion, wherein a permeability which said center portion exhibits when an external magnetic field is applied thereto is higher than a permeability of said marginal portion when the external magnetic field is applied.

* * * * *

UNITED STATES PATENT AND TRADEMARK OFFICE
CERTIFICATE OF CORRECTION

PATENT NO. : 6,838,966 B2 Page 1 of 1
APPLICATION NO. : 10/776893
DATED : January 4, 2005
INVENTOR(S) : Yuji Inoue It is certified that error appears in the above-identified patent and that said Letters Patent is hereby corrected as shown below:

In Claim 5, column 11, line 34, delete "first set of" and insert therefor -- first set, --.

In Claim 7, column 11, line 65, after "directional magnetic" delete -- steel --.

In Claim 8, column 12, line 16, delete "and the ratio" and insert therefor -- and a ratio --.

In Claim 8, column 12, line 18, delete "directional magnetic steel" and insert therefor -- directional magnetic --.

In Claim 8, column 12, line 19, delete "higher E" and insert therefor -- higher than --.

In Claim 10, column 12, line 31, delete "sheet tile," and insert therefor -- sheet tile --.

Signed and Sealed this

Thirtieth Day of January, 2007

JON W. DUDAS
*Director of the United States Patent and Trademark Office*